United States Patent
Pluntke et al.

[11] Patent Number: 5,256,577
[45] Date of Patent: Oct. 26, 1993

[54] PROCESS FOR DETERMINING THE POSITION OF A P-N TRANSITION

[75] Inventors: Christian Pluntke, Hechingen; Christoph Thienel, Reutlingen; Volkmar Denner, Pfullingen, all of Fed. Rep. of Germany

[73] Assignee: Robert Bosch GmbH, Stuttgart, Fed. Rep. of Germany

[21] Appl. No.: 853,768

[22] Filed: Jun. 2, 1992

[30] Foreign Application Priority Data

Dec. 23, 1989 [DE] Fed. Rep. of Germany ....... 3942861

[51] Int. Cl.$^5$ ........................................... H01L 21/66
[52] U.S. Cl. .......................................... 437/8; 437/75; 437/153
[58] Field of Search .................. 437/7, 8, 75, 148, 149, 437/153, 154; 148/DIG. 162

[56] References Cited

U.S. PATENT DOCUMENTS

| | | | |
|---|---|---|---|
| 3,650,020 | 3/1972 | Mar | 437/8 |
| 4,100,486 | 7/1978 | Casowitz et al. | 437/8 |
| 4,863,548 | 9/1989 | Lee | 156/626 |
| 4,927,772 | 5/1990 | Arthur et al. | 437/148 |
| 5,010,029 | 4/1991 | Liu et al. | 437/8 |
| 5,082,792 | 1/1992 | Pasch et al. | 437/8 |

OTHER PUBLICATIONS

Patent Abstracts of Japan, vol. 9, No. 81 (E-307), summarizing JP 59-214,233 (A) publ. Dec. 4, 1984, Arimatsu/assigned Oki Denki Kogyo K.K.
Patent Abstracts of Japan, vol. 9, No. 291 (E-359), summarizing JP 60-132,337 (A) publ. Jul. 15, 1985, Ayabe/assigned Nippon Denki K.K.
Patent Abstracts of Japan, vol. 9, No. 298 (E-361), summarizing JP 60-136,326 (A) publ. Ju. 19, 1985, Kawaji/assigned Hitachi Seisakusho K.K.
Patent Abstracts of Japan, vol. 10, No. 164 (E-410), summarizing JP 61-016,541 (A) publ. Jan. 24, 1986, Kanezaki/assigned Matsushita Denshi Kogyo K.K.
Patent Abstracts of Japan, vol. 12, No. 174 (E-612), summarizing JP 62-282,444 (A) publ. Dec. 8, 1987, Ikeda/assigned Nippon Soken Inc.

Primary Examiner—Tom Thomas
Assistant Examiner—C. Chaudhari
Attorney, Agent, or Firm—Frishauf, Holtz, Goodman & Woodward

[57] ABSTRACT

The invention relates to a method of determining the position of a p-n junction or the depth of penetration of the diffused electrode in the case of semiconductor devices produced by planar technology. According to the invention, a test pattern which comprises N pairs of windows, the spacing of which increases from pair to pair, is included in exposure. During the diffusion operation, the tubs produced overlap in the pairs of windows lying relatively close together, touch in one pair of windows ($n_o$) and are separate from each other in pairs of windows lying relatively far apart. With the aid of a resistance measurement, the pair of windows ($n_o$) in which the two tubs are still just touching is established, from which the lateral depth of penetration $Y_j$ is obtained as half the spacing of this pair of windows. From the lateral depth of penetration, the vertical depth of penetration $X_j$ can be established by means of the relationship $X_j = C \cdot Y_j$. In developments of the method, there is also specified a correction possibility for the difference between layout dimension and etching dimension as well as a further possibility of establishing the exact value of the lateral depth of penetration $Y_{jo}$. In the case of this possibility, the doping of the material which is diffused into can be determined.

9 Claims, 2 Drawing Sheets

PROCESS FOR DETERMINING THE POSITION OF A P-N TRANSITION

FIELD OF THE INVENTION

The invention relates to a method of determining the position of a p-n junction or the depth of penetration of the diffused electrode in the case of semiconductor devices produced by planar technology.

BACKGROUND:

It is necessary within the planar process in the production of semiconductor devices to keep a check on the depositions and diffusions carried out. For this purpose, it is generally customary in each batch to use one of the incoming chips as a so-called specimen chip just for determining the surface film resistance and the depth of penetration.

For this purpose, after diffusion and measuring of the film resistance on the specimen chip, a grooved section is produced. After treating with chemicals, p-type and n-type doped regions take on different colours, so that the section can be measured under a microscope and the depth of penetration approximately calculated.

In particular in the case of medium-scale integrated power semiconductors, it may be necessary to keep a check on several depositions and diffusions. This may mean that several specimen chips have to be taken along and evaluated. In addition, the handling of chemicals, use being made in particular also of hydrogen fluoride, is laborious and not unhazardous.

ADVANTAGES OF THE INVENTION

It is advantageously achieved by the method of determining the position of a p-n junction or the depth of penetration of the diffused electrode in the case of diodes/transistors produced in planar technology according to the invention that the data integrity is increased by the use of test patterns. All the chips of a batch can be structured with devices, generally producing an increase in yield. Any handling of chemicals, difficult to cope with, is dispensed with entirely. A special treatment of specimen chips in the coating or exposure step is likewise dispensed with. Mechanical work, such as the production of grooved sections, is no longer necessary. In addition, determination of the penetration depth can be automated. The penetration depth can be determined with greater accuracy than before. A constant check on the diffusions is possible at any location in the diffusion tube.

BRIEF DESCRIPTION OF THE DRAWINGS:

Two types of the method are represented by means of the drawing and are explained in more detail in the following description.

In the drawing.

DETAILED DESCRIPTION

The method according to the invention uses the relationship between vertical and lateral depth of penetration at the mask edge. The aim here is to determine the lateral outdiffusion or depth of penetration $Y_j$ at the surface and, with the aid of the constant $$C = \frac{X_j}{Y_j}$$

to calculate the vertical depth of penetration $X_j$.

This uses the fact that, depending on the doping concentration $N_b$ of the material which is diffused into, depending on the dose $Q_A$ introduced and depending on the diffusion constant D of the dopant as well as the diffusion duration $t_D$, a constant relationship $C(N_b, Q_A, D, t_D)$ is established between vertical depth of penetration $X_j$ and lateral depth of penetration $Y_j$. C can be calculated as a method constant for different conditions and is saved in a correlation.

For the determination of $Y_j$, in the lithography step before deposition at least one test pattern which contains N pairs of windows is included in exposure. In this case, the spacing $d_{layout}$ of the two windows within a pair is to increase respectively from pair to pair by a preferably constant amount $\Delta d$, so that in the first pair (n=1) there is the smallest spacing and in the last pair (n=N) there is the greatest spacing. This is represented in FIG. 1 in the left-hand column, where windows in masks or diode junctions a and b having different spacings are respectively represented.

Consequently, if $\Delta d = $ const, the following applies:

$$d^{(n)}_{layout} = d^{(1)}_{layout} + (n-1) \cdot \Delta d. \quad (n=1 \ldots N)$$

Figure 1:
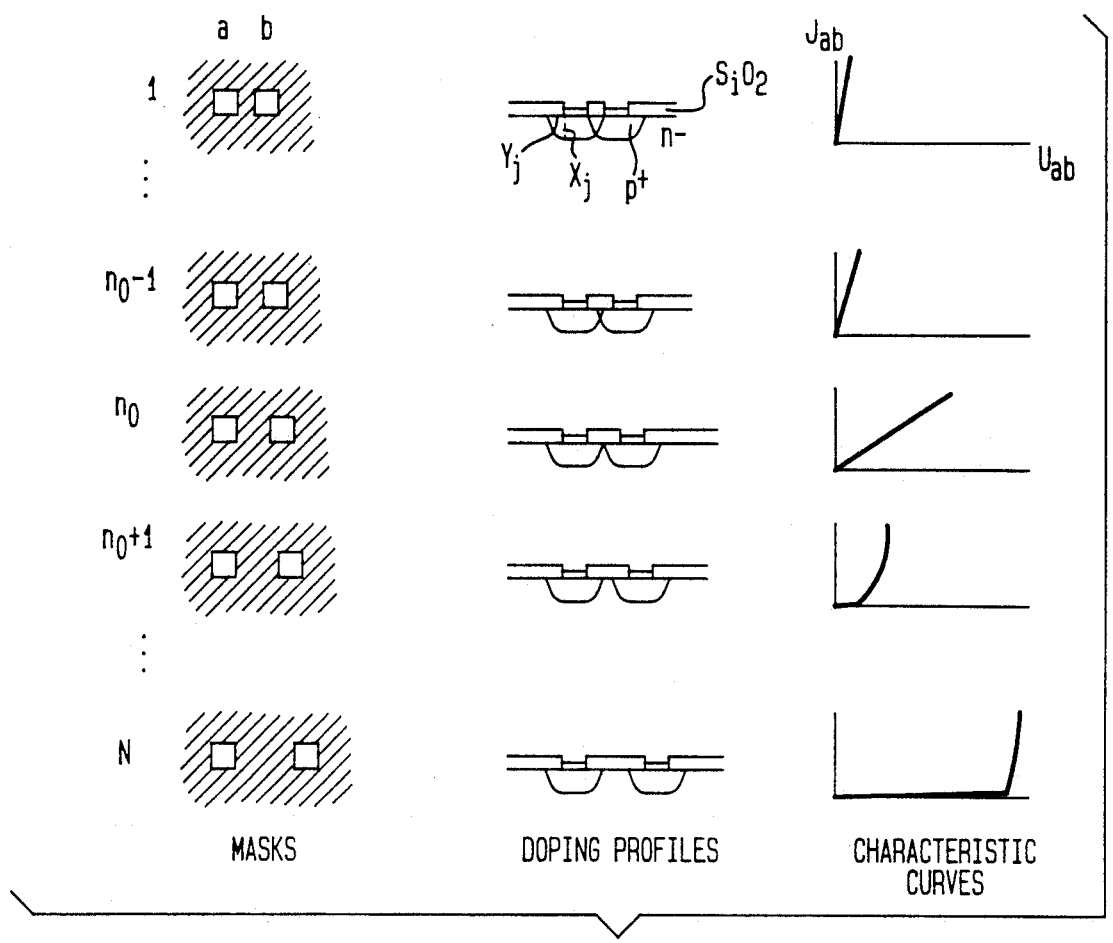
FIG. 1 shows masks, doping profiles and characteristic curves of pairs of windows with different spacings.

If the layout spacings of the test pattern have been chosen correctly, the two tubs to be diffused laterally onto each other overlap in the case of pair 1, whereas they are separate from each other in the case of pair N (middle column in FIG. 1).

After deposition, diffusion and possibly renewed opening of the windows of the test pattern in the following lithography step, the electrical resistance between the openings can be measured by contacting in the openings of in each case one pair.

An ohmic resistance line is measured at pair 1 and the punch-through voltage of the diode b, which is operated in reverse direction, is measured at pair N. In this measurement, the diode a is advantageously short-circuited, so that no lateral transistor effects additionally occur.

Between the pairs of windows 1 and N there is a pair $n_o$, in which the two tubs are still just touching. This means that in pair $n_o-1$ an overlap already occurs, whereas in pair $n_o+1$ the conducting connection between the two tubs is only made possible by punch-through of the space-charge zone of the blocking p-n junction on the other tub.

Pair $n_o$ can be easily found by analysis of the current-voltage relationship of all the pairs of windows. As is evident from the third column of FIG. 1, up until the pair of windows $n_o$ there is a linear, ohmic relationship between current and voltage. In a range above this, with $n > n_o$, the current-voltage relationship becomes non-linear, from which the pair $n_o$ can be determined.

Consequently, the variable $d^{(n_o)}_{layout}$ can be determined. However, owing to the undercutting of the photoresist, this variable does not correspond to the effectively acting variable $d^{(n_o)}_{eff}$, but has to be corrected by twice the undercutting per oxide edge $d_u$. Consequently, the following relationship applies:

$$d_{eff}^{(n_o)} = d^{(n_o)}_{layout} - 2d_u.$$

Figure 2:
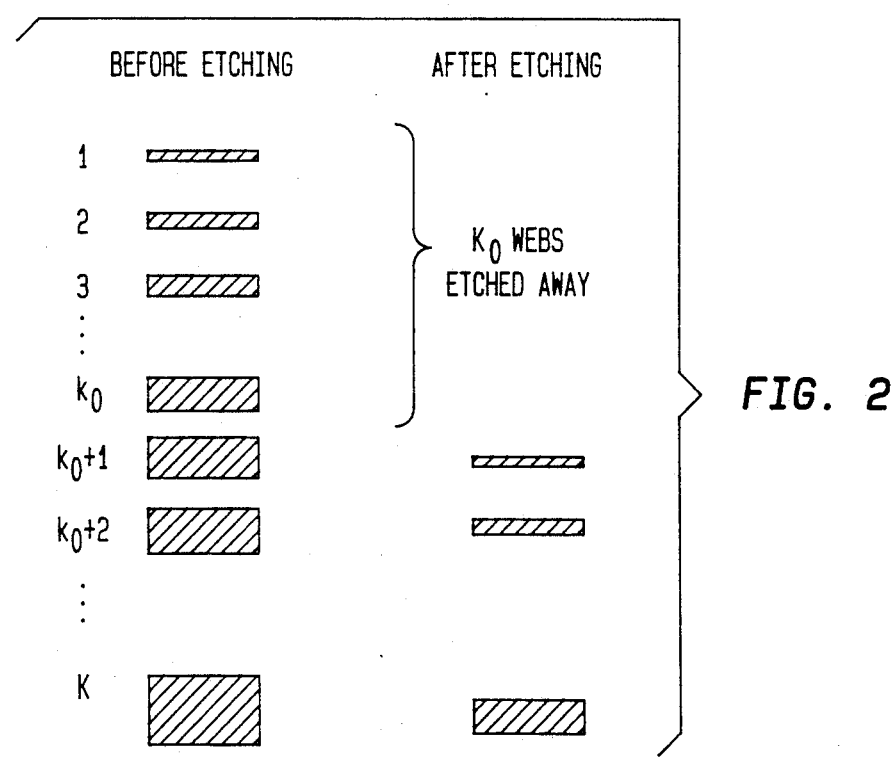
FIG. 2 shows a test pattern with oxide webs.

For the determination of $d_u$, a number K of dark fields are provided in the test pattern, so that in the positive process a series of oxide webs is produced, as is represented in FIG. 2, in the left-hand column. The width of these fields $b^{(k)}_{layout}$ increases from field to field by a preferably constant amount $\Delta b$. Thus, if $\Delta b = $ const, the following applies for the width of the fields:

$$b^{(k)}_{layout} = b^{(1)}_{layout} + (k-1) \cdot \Delta b. \quad (k = 1 \ldots K)$$

Given a suitable choice for the width of the fields $b^{(k)}_{layout}$ and the correct number K of fields, the undercutting has the effect that the narrowest $k_o$ oxide webs are just etched away and, of the web case $k_o + 1$, etching remains are left. In the case of all wider webs, with $k > k_o + 1$, there are at least distinct oxide edges, where $1 < k_o < K$.

By counting off the $K - k_o$ oxide webs which are left, $k_o$ and consequently the undercutting can be determined:

$$b^{(k_o)}_{layout} = 2 \, d_u.$$

Consequently, the lateral depth of penetration of a p-n junction $$Y_j = \frac{d_{eff}}{2}$$

and from it, with $$C = \frac{X_j}{Y_j}$$

the vertical depth of penetration $X_j$ can be determined.

To sum up, if $\Delta d = \Delta b$ is chosen, the following applies:

$$Y_j = \frac{1}{2} \cdot (d^{(1)}_{layout} - b^{(1)}_{layout} + (n_0 - k_0) \cdot \Delta d) \quad (I)$$

$$X_j = C(N_b, Q_A, D, t_D) \cdot Y_j \quad (II).$$

For the determination of the vertical depth of penetration, all that is necessary is to establish $n_o$ and $k_o$ by measuring and counting-off and enter them.

In the case of the method described above, $n_o$ is determined by means of the evaluation of a resistance measurement or the characteristic curves over all the pairs of windows. With the further development of the method described below in conjunction with FIGS. 3 and 4, there is the possibility of distinctly reducing the test pattern and at the same time making the determination of the position of the p-n junction even more simple and precise.

In the test pattern, the relationship between the index n and the reverse voltage $U_{sp}$ across the diode in reverse direction can be determined by measuring at the pairs of windows, it being possible to divide the overall variation of the reverse voltage $U_{sp}$ into three sections in dependence on n. The measuring current $J_o$ is in this case to remain constant. The three sections are entered in FIG. 3 by the Roman numerals I, II and III.

The Section I concerns the range $1 \leq n \leq n_o$. There, the diffused-in tubs are connected to each other and there is no punch-through. The voltage values there are small and virtually constant.

The Section II concerns the range $n_o < n < n'$. Here, the tubs are separated and punch-through occurs. In this range, the voltage $U_{sp}$ increases with increasing n.

The third Section III concerns the range $n' \leq n \leq N$. The tubs there are separate and so far removed from each other that punch-through can no longer take place. The breakdown takes place at the surface. Therefore, the measured voltage $U_{sp}$ is independent of n.

The precise position of the transition from Section I to Section II is sought, this position corresponding to the true lateral depth of penetration $Y_{jo}$. When establishing the punch-through voltage as a function of the extent $l$ of the space-charge zone in the material which is diffused into, it is found in the region II that a parabola optimally describes the relationship for a wide range of p-n junctions produced in the planar manner, that is to say the following applies in the region II:

$$U \propto l^2 \text{ or } l \propto U^{\frac{1}{2}}.$$

Figure 3:
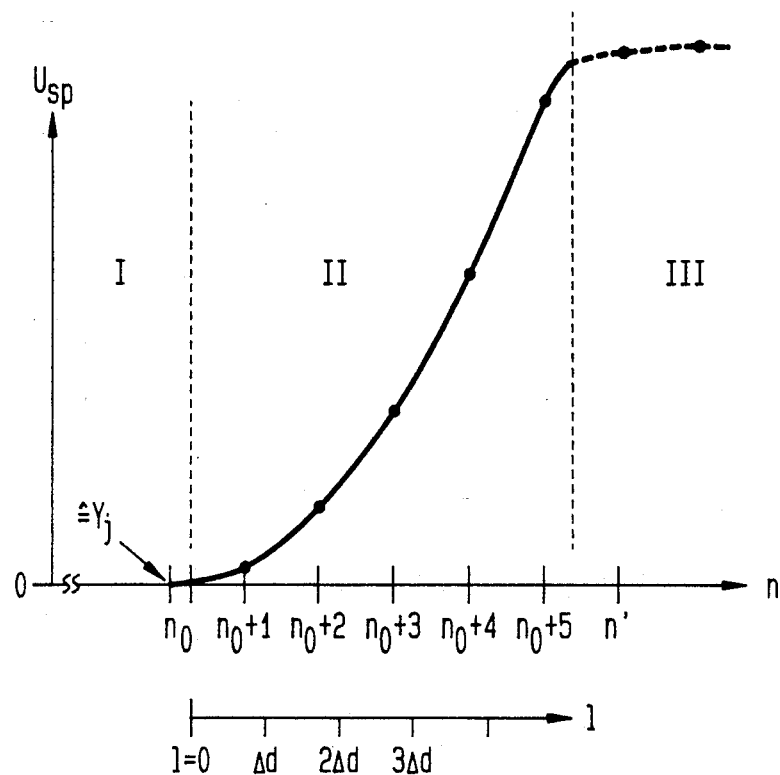
FIG. 3 shows a voltage parabola, which reproduces the relationship between the punch-though voltage U and the extent 1 of the space-charge zone in the material which is diffused into.
Figure 4:
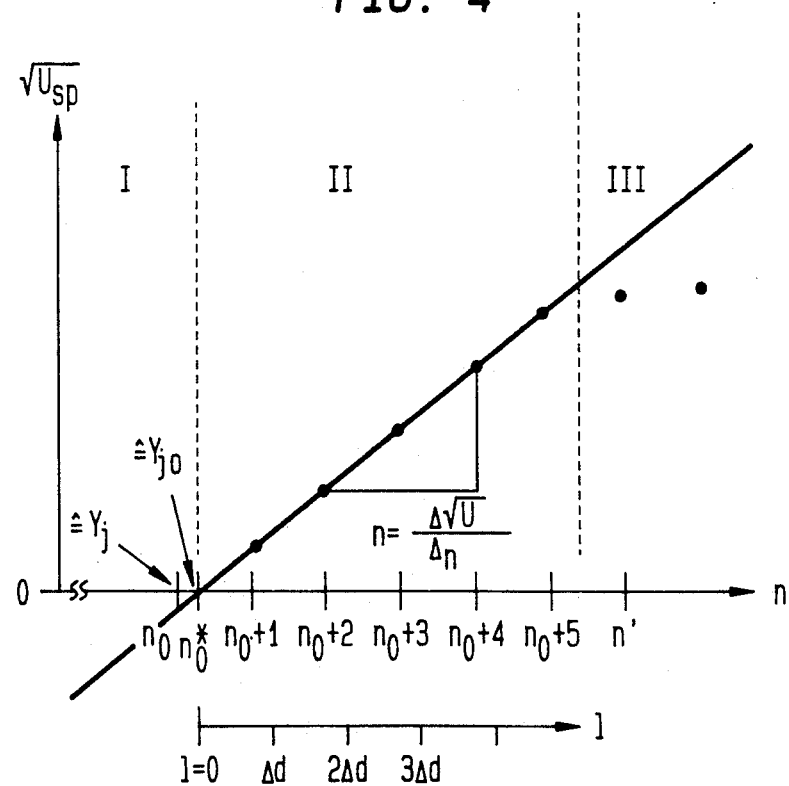
FIG. 4 shows the straight line obtained from the voltage parabola according to FIG. 3 by raising to the power of 0.5.

This relationship is entered in FIG. 3 as a dependence of the reverse voltage $U_{sp}$ across the diode b on the index n or on the extent $l$ of the space-charge zone in the region II.

The U values raised to the power of 0.5 in the region II lie on a straight line with the sought axis intercept $n_o^*$ and the slope $$m = \frac{\Delta \sqrt{U}}{\Delta n}.$$

This straight line can be determined from two measurements on the voltage parabola (FIG. 3). Two such measuring points are entered, for example, in FIG. 4, from which points the slope m and the position of the corresponding line section were established. By extending the straight line, the zero crossing is obtained at the point $n_o^*$. For the determination of $Y_{jo}$, the generally not natural number $n_o^*$ is inserted in Equation (I) instead of $n_o$. The insensitivity to measuring influences becomes greater, however, the more measuring points are used for the $Y_{jo}$ determination. In principle, this type of $Y_{jo}$ [sic] determination produces the value of the true, lateral depth of penetration $Y_{jo}$ more exactly than the measurement by the method described above. There, the index $n_o$ of that pair of windows where there was last an ohmic connection between the diffused-in tubs is established. This means, however, that the true, lateral depth of penetration must lie between the indices $n_o$ and $n_o + 1$. This point is not accessible for the measurement by the first method, but it is by the second method by fitting of the voltage parabola.

The slope m of the straight line provides information on the doping concentration $N_b$ or the resistivity $\rho$ of the material which is diffused into. The slope m describes the opening of the voltage parabola and is all the smaller the smaller $N_b$ becomes or the greater the resistivity $\rho$ is. With the aid of the slope m, consequently the doping concentration $N_b$ or the resistivity $\rho$ can be estimated, provided that these variables have been set in relation to each other in a correlation.

With the present method of determination, in theory the test pattern could be reduced to two pairs of windows. In practice, given the correction mentioned above by twice the undercutting ($2 \cdot d_u$), enough pairs of windows have to be provided that at least two measurements on the voltage parabola are possible in the case of all $k_o$ values occurring.

What is claimed is:

1. Method of determining the lateral and vertical depth of penetration of tubs made in the semiconductor material by indiffusion of a dopant, respectively forming a p-n junction against the semiconductor material, in the case of semiconductor devices produced by planar technology, a mask with windows being formed on the semiconductor material and the dopant for forming the tubs being diffused in through the windows in the semiconductor material and, furthermore, at the same time as the indiffusion of the said tubs, a test pattern being incorporated in the semiconductor material, characterised in that the test pattern contains N pairs of further tubs, formed by the same dopant, and N pairs of windows, through which the dopant for forming the further tubs is introduced and which are arranged such that the spacing of the two windows of a pair increases from pair to pair, so that in the first pair (n=1) there is the smallest spacing and in the last pair (n=N) there is the greatest spacing, in that the spacing of the pairs of windows is chosen such that the tubs produced in the planar process overlap in the first pair of windows (n=1) and are separate from each other in the last pair of windows (n=N), so that in between there lies a pair of windows (n=$n_o$) in which the two tubs are approximately still just touching, in that, after producing the p-n junction, the current-voltage characteristic is measured by contacting in the windows of in each case one pair and, with the aid of this measurement, that pair of windows (n=$n_o$) in which the tubs are still just touching is established, and in that from this the lateral depth of penetration ($Y_j$) is established as half the spacing (d) of the windows of the pair (n=$n_o$)

$$Y_j = \frac{d}{2}$$

and from this the vertical depth of penetration ($X_j$) is established by means of the relationship $$X_j = C \cdot Y_j$$

where C describes the relationship between the lateral depth of penetration ($Y_j$) and the vertical depth of penetration ($X_j$), in which method, in the resistance measurement for establishing the pair of windows (n=$n_o$), the current-voltage relationship of the pairs of windows is analysed, the tubs overlapping, or touching in pairs of windows (n≦$n_o$) having relatively small spacings and, as a result, there is a resistance behaviour with a linear current-voltage relationship, and the conducting connection between the tubs in pairs of windows (n>$n_o$) having relatively great spacings only being possible by punch-through of the space-charge zone of the blocking p-n junction to the other tub, with a non-linear current-voltage relationship, so that the transition from the linear to the non-linear current-voltage relationship determines the pair of windows (n=$n_o$).

2. Method according to claim 1, characterised in that the spacing of the two windows of a pair increases from pair to pair by a constant amount $\Delta d$, so that the following applies:

$$d^{(n)} = d^{(1)} + (n-1) \cdot \Delta d \quad (n = 1 \ldots N).$$

3. Method according to claim 1, characterised in that the exact position is found of the junction at which, on the basis of the given, true lateral depth of penetration ($Y_{jo}$), the tubs of the corresponding pair of windows would be still just touching, this position lying between the values from the pairs of windows ($n_o$) and ($n_o+1$), with $$Y_j = \frac{d^{(n_o)}}{2} \leq Y_{jo} < \frac{d^{(n_o+1)}}{2}$$

by using a relationship between punch-through voltage U and the extent 1 of the space-charge zone in the material which is diffused into, with $$U \sim 1^\alpha \text{ or } 1 \sim U^{1/\alpha},$$

establishing a line section by at least three measurements and raising the voltage values to the power of $1/\alpha$ in a diagram $U^{1/\alpha}$ over the increasing window pair index (n) with the slope $$m = \frac{\Delta(U^{1/\alpha})}{\Delta n}$$

and extending this line section to the zero crossing ($U^{1/\alpha}=0$), it being possible to determine from the position of this zero crossing the true value of the lateral depth of penetration ($Y_{jo}$).

4. Method according to claim 1, characterised in that, at a pair of windows, the punch-through voltage of a diode (b), which is operated in reverse direction, is measured and the other diode (a) is short-circuited during this time.

5. Method according to claim 1, characterised in that the relationship between the reverse voltage across the diode (b) operated in reverse direction and the extent 1 of the space-charge zone at the said diode (b) is used to determine the doping $N_b$ of the material which is diffused into, since the following applies:

$$1 = C_0 \cdot (U_{sp}/N_b)^{1/\alpha}, \quad C_0 = \text{const.} \rightarrow$$

$$N_b^{1/\alpha} = C_1 \cdot \Delta(U_{sp}^{1/\alpha})/\Delta n = C_1 \, m.$$

$$C_1 = C_0/\Delta d \rightarrow$$

$$N_b = (C_1 \cdot m)^\alpha, \text{ where}$$

$\alpha$ and m are known and $C_1$ is established in a correlation.

6. Method according to claim 1, characterised in that the current-voltage relationship is established at pairs of windows having overlapping tubs (n≦$n_o$), in that the transition from the linear to the non-linear current-voltage relationship is found, in that the dependence of the resistance on the window spacing is analysed in the range (n≦$n_o$) and a conclusion is consequently drawn as to that window spacing at which the tubs are still just touching and in that consequently the true lateral depth of penetration ($Y_{jo}$) is determined.

7. Method according to claim 1, characterised in that the spacing value (d) established by means of the electrical measurement or the lateral depth of penetration ($Y_j$)

established from it is corrected by the difference $2 d_u$ between layout dimension and etching dimension to the effectively acting spacing value $d_{eff}$, so that the following applies:

$$d_{eff}^{(nO)} = d_{layout}^{(nO)} - 2d_u.$$

8. Method according to claim 7, characterised in that $d_u$ is obtained by there being provided in the test pattern a number (K) of fields of the width $$b_{layout}^{(k)}, (k=1 \ldots K)$$

such that, in the planar process, a series of oxide webs of different widths are produced, which are preferably arranged such that the web width increases from oxide web to oxide web, that the difference between layout dimension and etching dimension arising in the planar process causes the narrower oxide webs ($k=1$ to $k=k_o$, with $1 \leq k_o \leq K$) to disappear, so that only the wider oxide webs ($k \geq k_o+1$) are left, and that $k_o$ is determined by counting off the existing oxide webs and the difference between layout dimension and etching dimension is established as:

$$d_u = \frac{1}{2} \cdot b_{layout}^{(k0)}$$

9. Method according to claim 8, characterised in that the width of the fields increases from field to field by a constant amount $\Delta b$, so that the following applies:

$$b_{layout}^{(k)} = b_{layout}^{(1)} + (k-1) \cdot \Delta b \ (k=1 \ldots K).$$

* * * * *